United States Patent
Aipperspach et al.

(10) Patent No.: US 6,635,518 B2
(45) Date of Patent: Oct. 21, 2003

(54) SOI FET AND METHOD FOR CREATING FET BODY CONNECTIONS WITH HIGH-QUALITY MATCHING CHARACTERISTICS AND NO AREA PENALTY FOR PARTIALLY DEPLETED SOI TECHNOLOGIES

(75) Inventors: Anthony Gus Aipperspach, Rochester, MN (US); Jente Benedict Kuang, Lakeville, MN (US); John Edward Sheets, II, Zumbrota, MN (US); Daniel Lawrence Stasiak, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 09/825,704

(22) Filed: Apr. 4, 2001

(65) Prior Publication Data

US 2002/0145174 A1 Oct. 10, 2002

(51) Int. Cl.$^7$ .......................... H01L 21/00; H01L 21/84; H01L 21/338; H01L 21/8238; H01L 27/01
(52) U.S. Cl. .................. 438/151; 438/154; 438/163; 438/175; 438/214; 438/280; 257/347; 257/348; 257/349; 257/354
(58) Field of Search ................................ 438/163, 164, 438/175, 214, 280, 282, 291, 155, 157, 283, 289, 217, 154, 151; 257/348, 349, 347, 354

(56) References Cited

U.S. PATENT DOCUMENTS 5,504,027 A * 4/1996 Jeong et al. .................. 437/52
6,429,069 B1 * 8/2002 Dennison et al. ........... 438/253

* cited by examiner

Primary Examiner—Olik Chaudhuri
Assistant Examiner—Neal Berezny
(74) Attorney, Agent, or Firm—Joan Pennington

(57) ABSTRACT

Methods and apparatus are provided for creating field effect transistor (FET) body connections with high-quality matching characteristics and no area penalty for partially depleted silicon-on-insulator (SOI) circuits. The FET body connections are created for partially depleted silicon-on-insulator (SOI) technologies by forming adjacent FET devices inside a shallow trench shape. The adjacent FET devices share a common diffusion area, such as source or drain. Selectively spacing apart adjacent gate lines form an underpath connecting bodies of the adjacent FET devices. The underpath is defined by forming an undepleted region on top of a buried oxide layer. The adjacent polysilicon gate lines are selectively spaced apart to define a depth of depletion in a shared diffusion region for creating the underpath. Also, adjacent FET devices with connecting bodies can be built by adding an ion implant masking step to the fabrication process. This masking step changes the depletion depth under the shared diffusion area. As a result an underpath body connection is formed. Such methods of building adjacent FET devices with an underpath connecting the two device bodies can be used in combination.

8 Claims, 3 Drawing Sheets

SOI FET AND METHOD FOR CREATING FET BODY CONNECTIONS WITH HIGH-QUALITY MATCHING CHARACTERISTICS AND NO AREA PENALTY FOR PARTIALLY DEPLETED SOI TECHNOLOGIES

FIELD OF THE INVENTION

The present invention relates methods and apparatus for creating field effect transistor (FET) body connections with high-quality matching characteristics and no area penalty for partially depleted silicon-on-insulator (SOI) technologies.

DESCRIPTION OF THE RELATED ART

In partially depleted silicon-on-insulator (SOI) technologies, it is often desirable or required to create P-channel field effect transistor (PFET) and N-channel field effect transistor (NFET) body connections. Typically external metal contacts are used for such FET body connections. External body contacts are very area costly. One body contact per device can easily increase a cell layout area by 50% to 100%.

External body contacts are often sources of parameter mismatches, which are undesirable for dual-railed or differential type of circuits that require parameter matching. The quality of body contacts is very difficult to control in the fabrication process. There are many factors that affect matching quality of devices, such as, ohmic contact quality of the body contacts, bias-dependent body (sheet) resistivity, and uncertainty in the number of physical layout squares along the length of the body when making body contacts.

Also adding external body contacts may destroy the on-pitch layout property due to width expansion in either or both x and y dimensions. A drawback of making external body contacts is that easy design migration and efficient use of existing design data are prevented.

A need exists for an effective mechanism for creating field effect transistor (FET) body connections. It is desirable to provide a way to create FET body connections with high-quality matching characteristics and no area penalty for partially depleted silicon-on-insulator (SOI) circuits.

SUMMARY OF THE INVENTION

A principal object of the present invention is to provide methods and apparatus for creating FET body connections with high-quality matching characteristics and no area penalty for partially depleted silicon-on-insulator (SOI) circuits. Other important objects of the present invention are to provide such methods and apparatus for creating FET body connections with high-quality matching characteristics and no area penalty for partially depleted silicon-on-insulator (SOI) circuits substantially without negative effect and that overcome many of the disadvantages of prior art arrangements.

In brief, methods and apparatus are provided for creating FET body connections with high-quality matching characteristics and no area penalty for partially depleted silicon-on-insulator (SOI) circuits. The field effect transistor (FET) body connections are created for partially depleted silicon-on-insulator (SOI) technologies by forming adjacent FET devices inside a shallow trench isolation shape. The adjacent FET devices share a common diffusion area, such as source or drain. An underpath connecting bodies of the adjacent FET devices is formed by selectively spacing apart adjacent gate lines.

In accordance with features of the invention, the underpath is defined by forming an undepleted region on top of a buried oxide layer. The adjacent polysilicon gate lines are selectively spaced apart to define a depth of depletion in a shared diffusion region for creating the underpath. Also, adjacent FET devices with connecting bodies can be built by adding an ion implant masking step to the fabrication process. This masking step changes the depletion depth under the shared diffusion area. As a result an underpath body connection is formed. Such methods of building adjacent FET devices with an underpath connecting the two device bodies can be used in combination.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
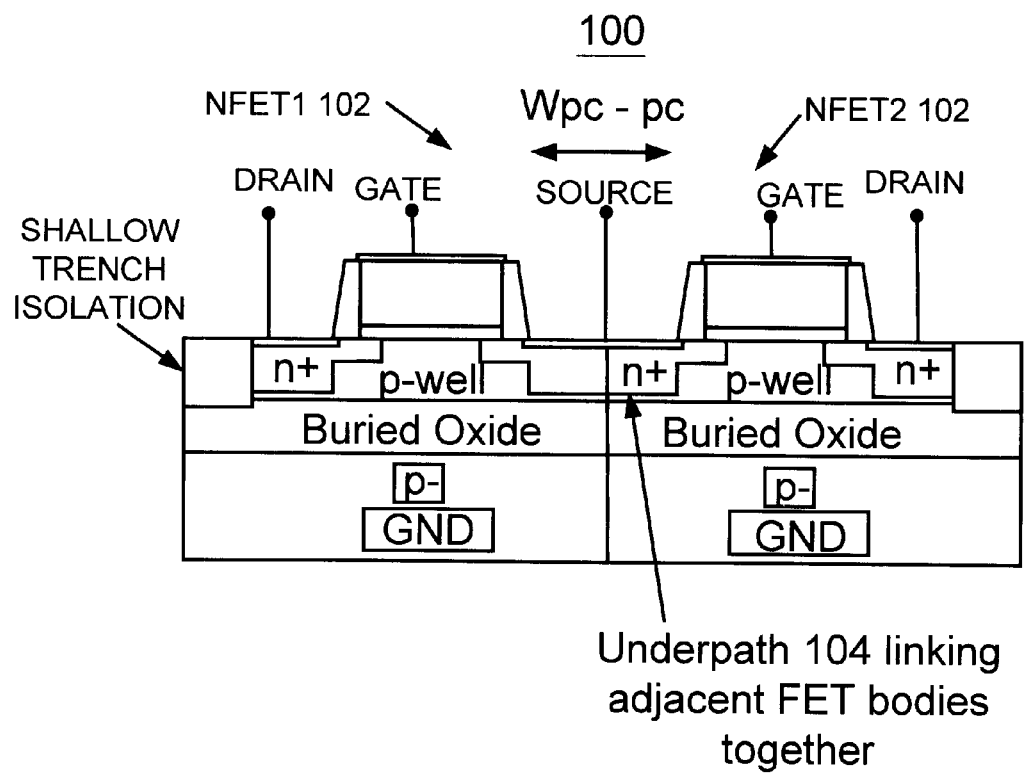
FIG. 1 is an exemplary cross-sectional representation illustrating an exemplary silicon-on-insulator (SOI) circuit including a pair of N-channel field effect transistors (NFETs) for implementing methods for creating FET body connections with high-quality matching characteristics and no area penalty in accordance with the preferred embodiment.

Having reference now to the drawings, in FIG. 1, there is shown an exemplary silicon-on-insulator (SOI) circuit in accordance with the preferred embodiment generally designated by the reference character 100. SOI circuit 100 includes a pair of NFETs 102 in accordance with the preferred embodiment defined inside one shallow trench shape with a common source region.

In accordance with features of the preferred embodiment, methods for creating FET body connections are provided utilizing an undepleted underpath 104 under the source region of an NFET or a PFET for adjacent FET body connection of the same channel type in a partially depleted silicon-on-insulator (SOI) technology. Advantages are provided by the methods for creating FET body connections of the preferred embodiment including that a compact layout area is facilitated. Good symmetry in layout and in vertical or cross-sectional device profile is provided, for example, ideal for applications in any circuit topology with a high degree of matching requirement. The drawbacks of externally making contacts to the floating bodies are avoided.

In a partially depleted SOI technology, adjacent devices inside the same shallow trench isolation shape may be resistively linked by a thin layer of undepleted p-region for N-channel field effect transistors (NFETs) or undepleted n-region for P-channel field effect transistors (PFETS) on top of a buried oxide layer.

Referring to FIG. 1, the existence of this thin conducting underpath 104 depends on depth of depletion in the shared source or drain diffusion region, which in turn depends on an adjacent polysilicon gate spacing, labeled Wpc-pc. The narrower the adjacent polysilicon gate spacing, Wpc-pc is, the thicker the undepleted or semi-neutral region is. In a partially depleted silicon-on-insulator (SOI) technology, only a shared diffusion region with no external metal contacts may have this underpath under certain fabrication process design conditions. Shared diffusions with external metal contacts are, by design having wider polysilicon spacing Wpc-pc, depleted to the buried thin oxide layer and therefore free of parasitic channels.

In accordance with features of the preferred embodiment, methods for creating FET body connections utilizing a process window for creating or prohibiting an underpath 104 as shown in FIG. 1 by the spacing between adjacent polysilicon gate lines, making virtual body connections without physically making external body contacts. This way of making virtual body connections has several advantages over contacting FET bodies by using metal contacts. FET body connections of the preferred embodiment are layout area efficient, while external body contacts are very area costly. FET body connections of the preferred embodiment provide high quality matching device characteristics, while external body contacts are sources of parameter mismatches. FET body connections of the preferred embodiment via underpath body linking is very compact, while adding external body contacts may destroy on-pitch layout property due to width expansion in both x and y dimensions. In dual-railed or differential type of circuits, the vertical doping profiles and electric field characteristics can be exactly symmetrical with proper layout when the underpath 104 links the adjacent FET bodies. This symmetry is an extremely desirable property for realizing high-quality matching electrical characteristics for the two body connected FETs even though the underpath 104 may not be low in resistivity.

Figure 2:
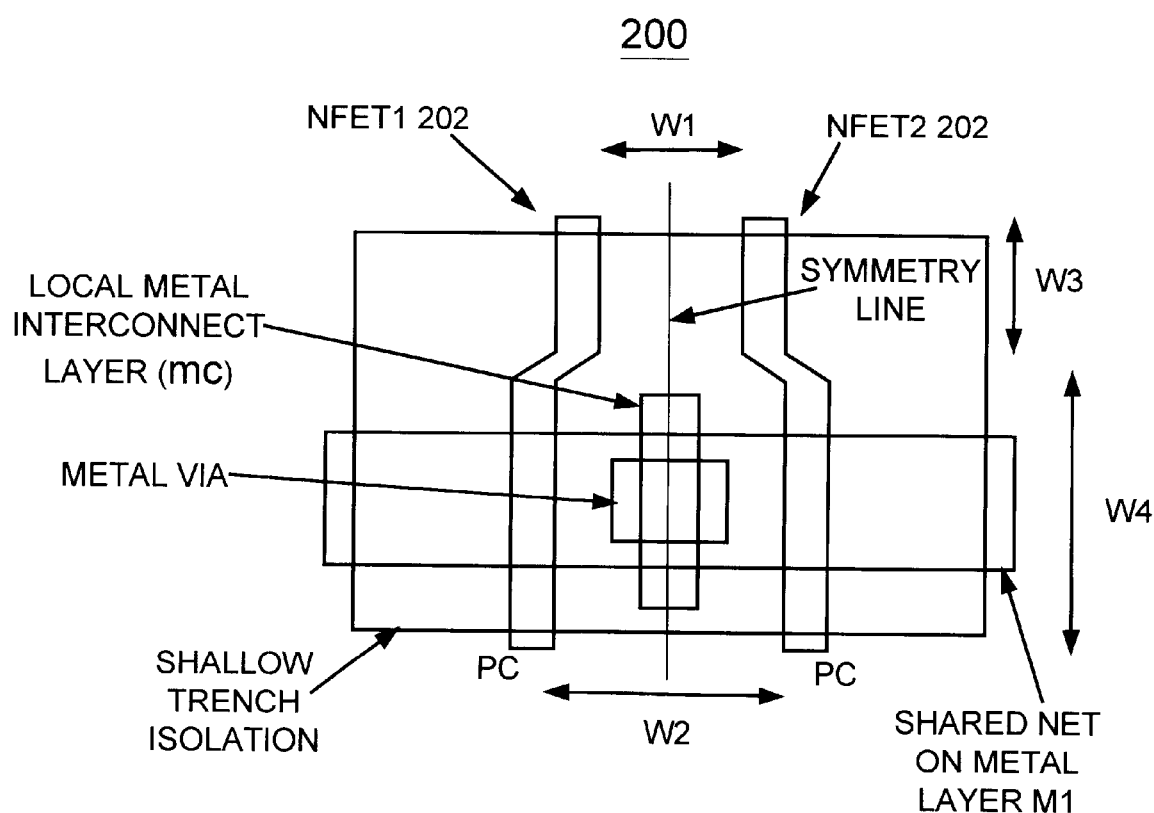
FIG. 2 is another exemplary representation illustrating another exemplary silicon-on-insulator (SOI) circuit including a pair of N-channel field effect transistors (NFETs) in accordance with the preferred embodiment.

Referring now to FIG. 2, there is shown another exemplary silicon-on-insulator (SOI) circuit in accordance with the preferred embodiment generally designated by the reference character 200. SOI circuit 200 includes a pair of N-channel field effect transistors (NFETs) NFET1, NFET2, 202 where matching is required for NFET1 and NFET2. For example, the layout arrangement of SOI circuit 200 shown in FIG. 2 including the matching NFET1 and NFET2, 202 advantageously can be used in a sense amplifier circuit 300 as shown and described with respect to FIG. 3. NFET1, NFET2, 202 in SOI circuit 200 provide an example layout where the bodies are connected and make an external electrical connection. As shown in FIG. 2, NFET1, 202 and NFET2, 202 are divided into two regions. A width portion labeled W3 illustrates an area where there is an underpath connecting bodies of NFET1, 202 and NFET2, 202. A width portion labeled W4 illustrates an area where there is metal contact area providing circuit connection to another device or devices, but with no body connection under it. In this case, the metal contact, for example, connects to the drain of the sense amplifier set device NFET 304 in FIG. 3.

It should be understood that the present invention is not limited to the illustrated two-region division. For instance, a layout can be arranged such that the underpath is created in the middle section, considering the channel width direction, making a three-region, metal contact, underpath, metal contact arrangement. As another example, a multi-fingered layout can also be provided using the basic two-region arrangement.

The local metal interconnect to polysilicon gate spacing (mc-pc) and the local metal interconnect (mc) width design rule of the process technology defines a spacing labeled W2. An optimal spacing WI can be different from the design rule for pc—pc spacing. The pc—pc spacing rule is ordinarily set up to prevent shorting under a yield consideration. A narrower W1 under the high yield constraint is possible for the purpose of body connection of the preferred embodiment since such connections are not long runs of polysilicon lines and are infrequently made. The value of W1 is empirically determined for each process technology.

It should be understood that a very low resistance underpath is not required to prevent body bias offset in order to maintain the matching threshold voltage characteristics of the two body connected FETs. So long as reasonable mutual modulation of the two connected FET bodies exists, no noticeable difference of body voltages will develop even though, for example, repetitive read operations are made for many access cycles in the SOI CMOS sense amplifier circuit 300 of FIG. 3.

Figure 3:
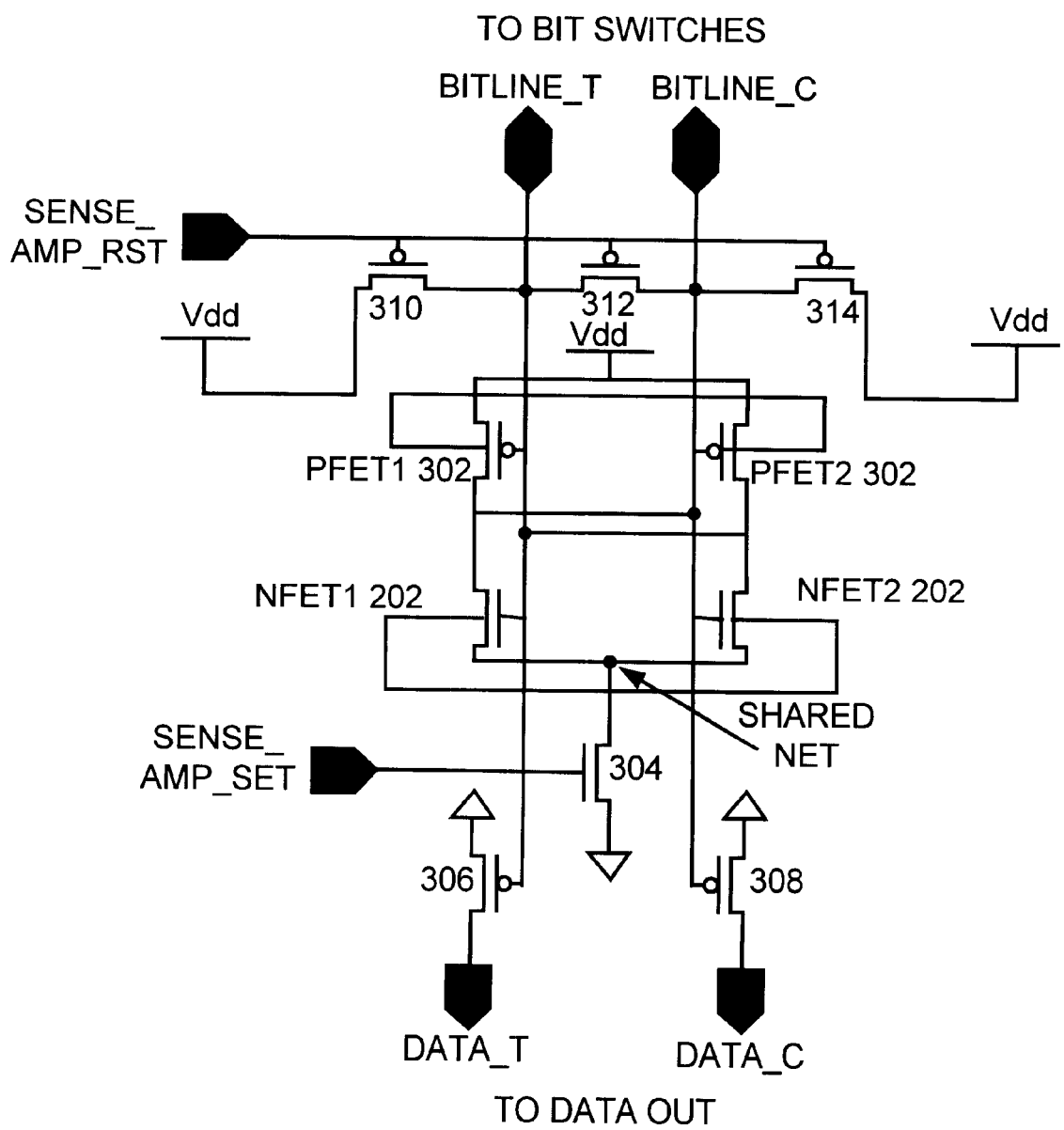
FIG. 3 is a schematic diagram illustrating a SOI CMOS sense amplifier circuit including the arrangement of NFETs of FIG. 2 in accordance with the preferred embodiment.

Having reference now to FIG. 3, there is shown a SOI CMOS sense amplifier circuit of the preferred embodiment generally designated by the reference character 300. As shown in FIG. 3, SOI CMOS sense amplifier 300 includes a pair of P-channel field effect transistors (PFETs) PFET1, PFET2, 302 respectively connected between a voltage supply Vdd and a pair of the N-channel field effect transistors (NFETs) NFET1, NFET2, 200. A gate of PFET1 302 and NFET2 302 is connected to a Bitline_T. A gate of PFET2 302 and NFET2 202 is connected to a Bitline_C. An NFET 304 connected between NFET1, NFET2 202 and ground, receives a gate input of sense amp set. A pair of P-channel field effect transistors (PFETs) 306 and 308 having a respective gate input of Bitline_T and Bitline_C, are respectively connected between ground and data out, Data_T and Data_C. A gate input of sense_amp_rst is applied to a gate of PFETs 310, 312 and 314. PFETs 310 and 314 are respectively connected between voltage supply Vdd and Bitline_T or Bitline_C. PFET 312 is connected between Bitline_T and Bitline_C.

In accordance with the preferred embodiment, the bodies of cross-coupled NFETs NFET1, NFET2 202 are bodies connected using the method of the preferred embodiment. PFET bodies optionally of PFETs PFET1, PFET2, 302 are similarly connected, as shown.

In accordance with another preferred embodiment, an ion implant masking step is added to the SOI process to build the FETs without the body isolation between the devices. This ion implant is applied to devices where the underpath body connection is desired. This allows the user to selectively tie together or connect FET bodies where needed. It should be understood that this feature is not restricted to sense amplifier designs, but rather allows for a wide range of applications. Such embodiment also has the advantage of easy layout conversion from a bulk to SOI technology since the original physical image can essentially be kept unchanged. With this embodiment, design rules for all the masking steps remain the same with the only addition of one ion implant defining shapes or devices having linked bodies.

In accordance with a further preferred embodiment, the above techniques are used in combination. A reason for using these techniques in combination is that on certain occasions this can obtain maximum yield benefit. That is, the design rules for parameters W1 and W2 can be tailored to meet the specific fabrication process requirement. Another reason for using these techniques in combination is that a wider, lower body contact resistivity range can be achieved, as desired in most cases, for different circuit applications. The combination of these two techniques of the preferred embodiments allows added flexibility for both process and circuit design.

In summary, the methods of the preferred embodiments avoid the mismatch problems and the area inefficiency of making actual metal contacts to bodies.

While the present invention has been described with reference to the details of the embodiments of the invention shown in the drawing, these details are not intended to limit the scope of the invention as claimed in the appended claims.

What is claimed is:

1. A method for creating and for prohibiting field effect transistor (FET) body connections for partially depleted silicon-on-insulator (SOI) technologies comprising the steps of:

forming a plurality of adjacent FET devices inside a shallow trench shape;

providing a first spacing between adjacent gate lines for forming an underpath electrically connecting bodies of selected ones of said plurality of said adjacent FET devices; and providing a second spacing between adjacent gate lines for prohibiting said underpath for selected other ones of said plurality of adjacent FET devices; said second spacing being greater than said first spacing.

2. A method for creating and for prohibiting field effect transistor (FET) body connections for partially depleted silicon-on-insulator (SOI) technologies as recited in claim 1 wherein the step of providing said first spacing between adjacent gate lines for forming said underpath electrically connecting bodies of said selected ones of said plurality of said adjacent FET devices includes the step of forming an undepleted region on top of a buried oxide layer for defining said underpath.

3. A method for creating and for prohibiting field effect transistor (FET) body connections for partially depleted silicon-on-insulator (SOI) technologies as recited in claim 1 wherein the step of providing said first spacing between adjacent gate lines for forming said underpath electrically connecting bodies of said selected ones of said plurality of said adjacent FET devices includes the step of providing said first spacing between adjacent polysilicon gate lines to define a depth of depletion in a shared diffusion region.

4. A method for creating and for prohibiting field effect transistor (FET) body connections for partially depleted silicon-on-insulator (SOI) technologies as recited in claim 3 wherein said shared diffusion region is a shared source diffusion region for N-channel adjacent FET devices.

5. A method for creating and for prohibiting field effect transistor (FET) body connections for partially depleted silicon-on-insulator (SOI) technologies as recited in claim 3 wherein said shared diffusion region is a shared source diffusion region for P-channel adjacent FET devices.

6. A method for creating and for prohibiting field effect transistor (FET) body connections for partially depleted silicon-on-insulator (SOI) technologies as recited in claim 1 wherein the step of providing said first spacing between adjacent gate lines for forming said underpath electrically connecting bodies of said selected ones of said plurality of said adjacent FET devices includes the step of providing symmetrical vertical doping profiles and electric field characteristics for said adjacent FET devices.

7. A method for creating and for prohibiting field effect transistor (FET) body connections for partially depleted silicon-on-insulator (SOI) technologies as recited in claim 1 wherein the step of providing said first spacing between adjacent gate lines for forming said underpath electrically connecting bodies of said selected ones of said plurality of said adjacent FET devices includes the step of adding an ion implant masking step to the SOI process for building said selected ones of said plurality of said adjacent FET devices without body isolation between said adjacent FET devices.

8. A method for creating and for prohibiting field effect transistor (FET) body connections for partially depleted silicon-on-insulator (SOI) technologies as recited in claim 1 wherein the step of providing said second spacing between adjacent gate lines for prohibiting said underpath for said selected other ones of said plurality of said adjacent FET devices includes the step of forming a region depleted to a buried oxide layer for prohibiting said underpath.

* * * * *